(12) United States Patent
Ramaswamy et al.

(10) Patent No.: US 8,817,522 B2
(45) Date of Patent: Aug. 26, 2014

(54) UNIPOLAR MEMORY DEVICES

(75) Inventors: Durai Vishak Nirmal Ramaswamy, Boise, ID (US); Lei Bi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 13/590,758

(22) Filed: Aug. 21, 2012

(65) Prior Publication Data
US 2014/0056053 A1    Feb. 27, 2014

(51) Int. Cl.
*G11C 11/00* (2006.01)
*G11C 13/00* (2006.01)

(52) U.S. Cl.
CPC ................................. *G11C 13/0002* (2013.01)
USPC ........................................................ 365/148

(58) Field of Classification Search
CPC ........................ G11C 13/0002; G11C 13/0069
USPC ........................................................ 365/148
See application file for complete search history.

(56) References Cited

U.S. PATENT DOCUMENTS

| | | | |
|---|---|---|---|
| 6,972,985 B2 | 12/2005 | Rinerson et al. | |
| 7,974,117 B2 | 7/2011 | Tan et al. | |
| 8,067,762 B2 | 11/2011 | Ho et al. | |
| 8,173,989 B2 | 5/2012 | Lee et al. | |
| 2008/0001172 A1* | 1/2008 | Karg et al. | 257/194 |
| 2008/0090337 A1 | 4/2008 | Williams | |
| 2009/0034320 A1 | 2/2009 | Ueda | |
| 2009/0095985 A1 | 4/2009 | Lee et al. | |
| 2010/0095057 A1 | 4/2010 | Li et al. | |
| 2010/0155686 A1 | 6/2010 | Bratkovski et al. | |
| 2010/0277967 A1 | 11/2010 | Lee et al. | |
| 2011/0044089 A1 | 2/2011 | Goux et al. | |
| 2011/0140067 A1 | 6/2011 | Chen et al. | |
| 2011/0233504 A1 | 9/2011 | Liu et al. | |
| 2011/0310656 A1 | 12/2011 | Kreupl et al. | |
| 2012/0088328 A1 | 4/2012 | Phatak et al. | |
| 2012/0314468 A1* | 12/2012 | Siau et al. | 365/66 |
| 2013/0043452 A1* | 2/2013 | Meyer et al. | 257/4 |
| 2013/0043455 A1* | 2/2013 | Bateman | 257/5 |
| 2014/0061568 A1 | 3/2014 | Ramaswamy et al. | |

FOREIGN PATENT DOCUMENTS

| | | |
|---|---|---|
| KR | 1020090126530 A | 12/2009 |
| KR | 1020120046327 A | 5/2012 |
| WO | WO-2012044276 A1 | 4/2012 |
| WO | WO-2012102734 A1 | 8/2012 |
| WO | WO-2014031617 A1 | 2/2014 |
| WO | WO-2014036264 A1 | 3/2014 |

OTHER PUBLICATIONS

Kim, Sungho, et al., "Resistive Switching Characteristics of Sol-Gel Zinc Oxide Films for Flexible Memory Application", IEEE Transactions on Electron Devices, vol. 56, No. 4, (Apr. 2009), 696-699.
"International Application Serial No. PCT/US2013/055758, International Search Report mailed Jan. 7, 2014", 4 pages.
"International Application Serial No. PCT/US2013/055758, Written Opinion mailed Jan. 27, 2014", 9 pages.

\* cited by examiner

*Primary Examiner* — Hoai V Ho
(74) *Attorney, Agent, or Firm* — Schwegman Lundberg & Woessner, P.A.

(57) ABSTRACT

Electronic apparatus, systems, and methods can include a resistive memory cell having a dielectric structured as an operably variable resistance region between an oxygen source and an oxygen sink. The dielectric, oxygen source, and an oxygen sink can be structured as a field driven unipolar memory element with respect to generation and healing of a filament in the dielectric. Additional apparatus, systems, and methods are disclosed.

29 Claims, 7 Drawing Sheets

UNIPOLAR MEMORY DEVICES

BACKGROUND

The semiconductor device industry has a market-driven need to improve the operation of memory devices. Improvements can be addressed by advances in memory device design and processing.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
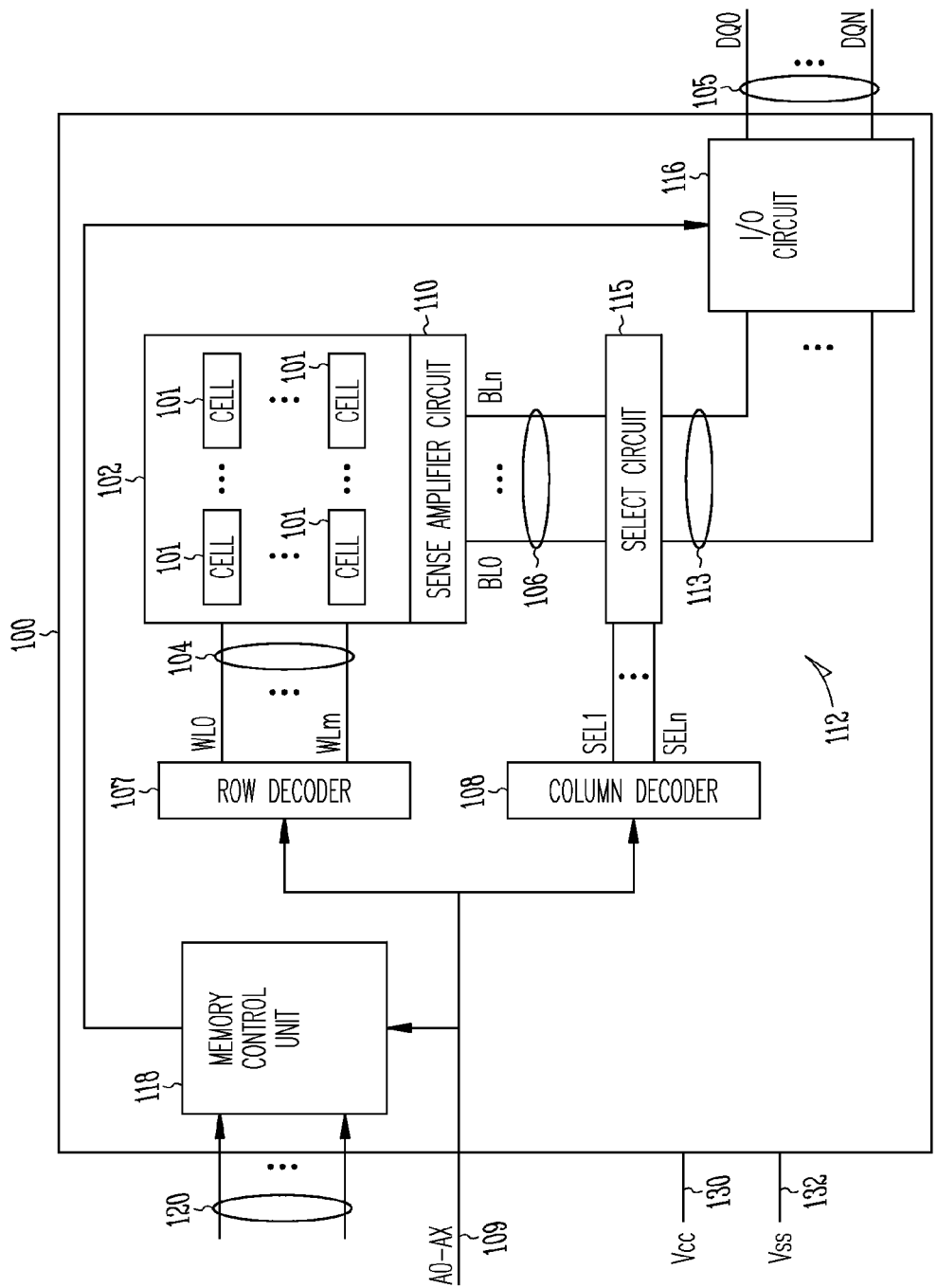
FIG. 1 shows a block diagram of an example memory device, in accordance with various embodiments.

FIG. 1 shows a block diagram of an example embodiment of a memory device 100. Memory device 100 can include a memory array 102 having a plurality of memory cells 101. A memory array is a systematic physical arrangement of memory cells that can be logically arranged according to a plurality of parameters. In various embodiments, each memory cell can be addressed according to values of two parameters. The two parameters may be referred to as a row and a column. A memory cell may be logically located in the memory array and indexed uniquely according to a value for a row and a value for a column. Rows and columns are not limited to a particular physical orientation or linear relationship, so that the logical arrangement can be vastly different than the physical arrangement. A column of a memory array may be arranged as a group of memory cells that can be accessed at the same time by a decoder assigned to column values. A row of a memory array may be arranged as a group of memory cells that can be accessed at the same time by a decoder assigned to row values.

Memory cells 101 can be arranged in rows and columns along with access lines 104 and first data lines 106. For example, access lines can be structured as wordlines to conduct signals WL0 through WLm and first data lines can be structured as bit lines to conduct signals BL0 through BLn. Memory device 100 can use access lines 104 and first data lines 106 to transfer information to and from memory cells 101. A row decoder 107 and a column decoder 108 decode address signals A0 through AX on address lines 109 to determine which ones of memory cells 101 are to be accessed.

A sense amplifier circuit 110 operates to determine the value of information read from memory cells 101 and the information read is communicated in the form of signals to first data lines 106. Sense amplifier circuit 110 can also use the signals on first data lines 106 to determine values of information to be written to memory cells 101.

Memory device 100 can include circuitry 112 to transfer information between memory array 102 and input/output (I/O) lines 105. Signals DQ0 through DQN on the I/O lines 105 can represent information read from or written into memory cells 101. I/O lines 105 can include nodes within memory device 100 (or alternatively, pins, solder balls, or other interconnect technologies such as controlled collapse chip connection (C4), or flip chip attach (FCA)) on a package where the memory device 100 can reside. Other devices external to memory device 100 can communicate with memory device 100 through I/O lines 105, address lines 109, or control lines 120. For example, such external devices can include a memory controller or a processor.

Memory device 100 can perform memory operations, such as a read operation, to read information from selected ones of memory cells 101 and a programming operation (also referred to as a write operation) to program (e.g., to write) information into selected ones of memory cells 101. Memory device 100 can also perform a memory erase operation to clear information from some or all of memory cells 101. A memory control unit 118 controls memory operations based on signals present on control lines 120. Examples of the signals on the control lines 120 can include one or more clock signals and other signals to indicate which operation (e.g., a programming or read operation) memory device 100 can or should perform. Other devices external to memory device 100 can control the values of the control signals on the control lines 120. The external devices can include, for example, a processor or a memory controller. Specific values of a combination of the signals on control lines 120 can produce a command, such as a programming or read command for example, that can cause memory device 100 to perform a corresponding memory operation. The corresponding memory operation can include, for example, a program, read, or erase operation.

Each of memory cells 101 can be programmed to store information representing a value of a single bit or a value of multiple bits such as two, three, four, or a higher number of bits. For example, each of memory cells 101 can be programmed to store information representing a binary value "0" or "1" of a single bit. The single bit per cell is sometimes called a single level cell. In another example, each of memory cells 101 can be programmed to store information representing a value representing multiple bits, such as one of four possible values "00," "01," "10," and "11" of two bits, one of eight possible values "000," "001," "010," "011," "100," "101," "110," and "111" of three bits, or one of another set of values of multiple bits. A cell that has an ability to store multiple bits is sometimes referred to as a multi-level cell or multi-state cell.

Memory device 100 can receive a supply voltage, including supply voltage signals Vcc and Vss, on a first supply line 130 and a second supply line 132, respectively. Supply voltage signal Vss can operate at a ground potential. The ground potential can have a value of approximately zero volts. Supply voltage signal Vcc can include an external voltage supplied to memory device 100 from an external power source such as a battery or an alternating current to direct current (AC-DC) converter circuitry.

Circuitry 112 of memory device 100 can include a select circuit 115 and an input/output (I/O) circuit 116. Select circuit 115 can respond to signals SEL1 through SELn to select signals on first data lines 106 and second data lines 113 that can represent the information read from or programmed into memory cells 101. Column decoder 108 can selectively activate the SEL1 through SELn signals based on the A0 through AX address signals on address lines 109. Select circuit 115 can select the signals on first data lines 106 and second data lines 113 to provide communication between memory array 102 and I/O circuit 116 during read and programming operations.

Memory device 100 can include a non-volatile memory device and memory cells 101 can include non-volatile memory cells such that memory cells 101 can retain information stored therein when power is disconnected from memory device 100. The power may be represented by the labels Vcc, Vss, or both.

Each of memory cells 101 can include a memory element having material, at least a portion of which can be programmed to change the resistance value of the material. Each of memory cells 101 can have a state corresponding to a resistance value when each of memory cells 101 is programmed in a programming operation. Different resistance values can thus represent different values of information programmed in each of memory cells 101.

Memory device 100 can perform a programming operation when it receives a programming command and a value of information to be programmed into one or more selected ones of memory cells 101. The programming command can be received from an external processor, a memory controller, or other controller. Based on the value of the information, memory device 100 can program the selected memory cells to cause them to have appropriate resistance values to represent the numerical or symbolic values of the information stored therein. Memory device 100 may include devices and memory cells, and operate using memory operations similar to or identical to those described below with reference to various other figures and embodiments discussed herein.

Figure 2:
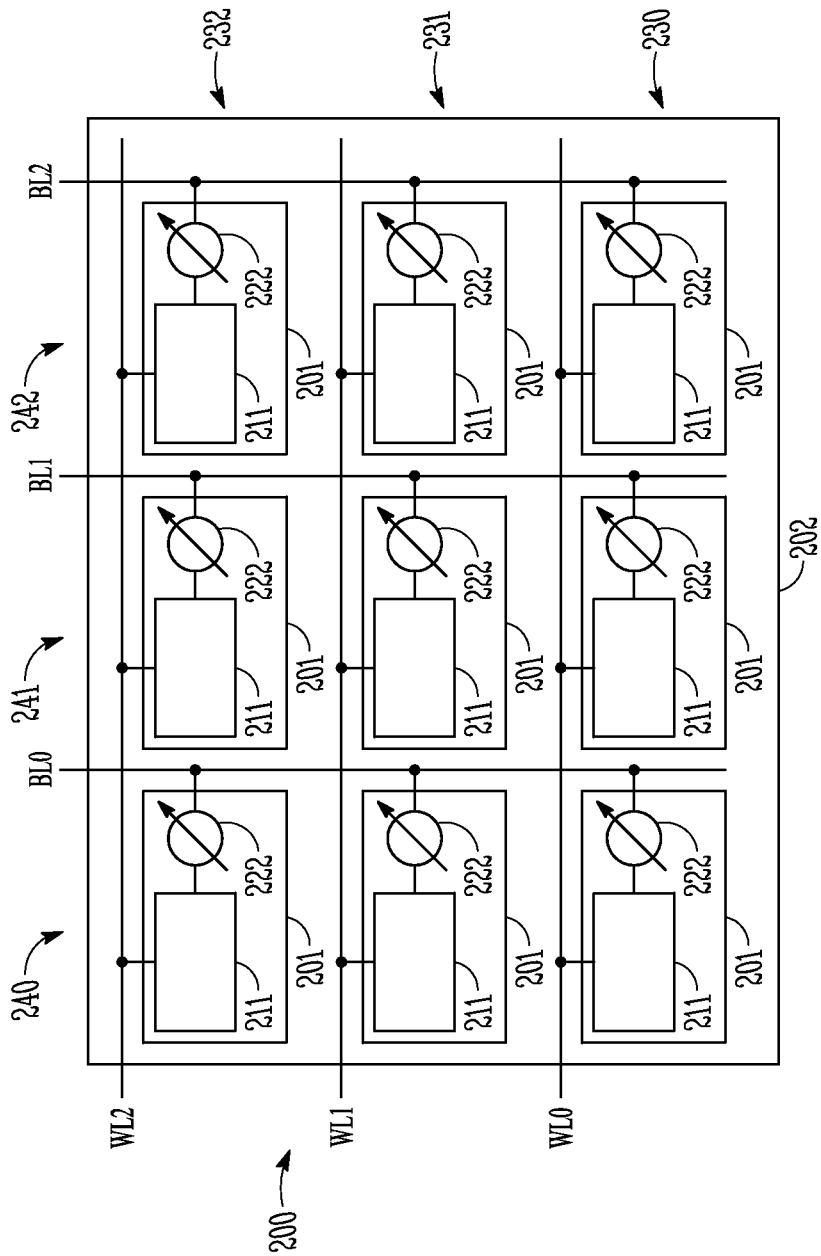
FIG. 2 shows a block diagram of features of an example memory device that includes a memory array having memory cells with access components and memory elements, in accordance with various embodiments.

FIG. 2 shows a block diagram of features of an example embodiment of a memory device 200 that includes a memory array 202 having memory cells 201 with access components 211 and memory elements 222. Memory array 202 may be similar or identical to memory array 102 of FIG. 1. Memory cells 201 can be arranged in a number of rows 230, 231, and 232 along with access lines to conduct signals such as signals WL0, WL1, and WL2. The access lines may be word lines. Memory cells 201 can also be arranged in a number of columns 240, 241, and 242 along with data lines to conduct signals such as signals BL0, BL1, and BL2. The data lines may be bit lines. Access components 211 can turn on, for example by using appropriate values of signals WL0, WL1, and WL2, to allow access to memory elements 222 to read information from or program information into the memory elements 222. Memory array 202 may have more or less than the number of memory cells 201 shown in FIG. 2.

Programming information into memory elements 222 can include causing memory elements 222 to have specific resistance values or specified ranges of resistance values. For a resistive random access memory (RRAM) cell, an electric field can be applied to move oxygen vacancies. Then, reading information from a memory element 222 can include measuring a resistance value of memory element 222. Measuring the resistance can include sensing a value of a current flowing through various ones of memory cells 201. Based on a measured value of the current, a corresponding value of the information stored in the memory can be determined. A determination of the information can be based on the value of the current.

Figure 3:
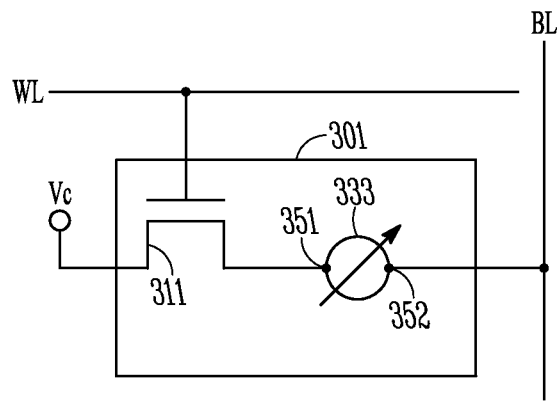
FIG. 3 shows a schematic diagram of an example memory cell having an access component coupled to a memory element, in accordance with various embodiments.
Figure 4:
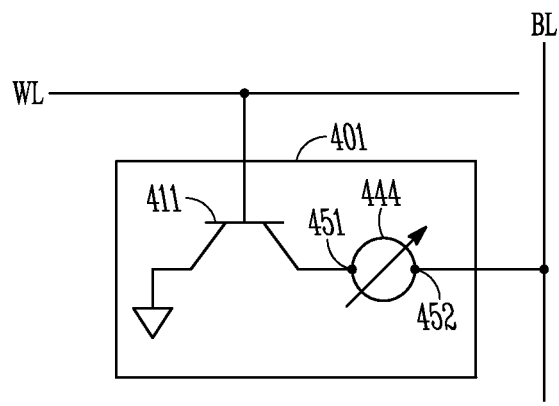
FIG. 4 shows a schematic diagram of an example memory cell having an access component coupled to a memory element, in accordance with various embodiments.
Figure 5:
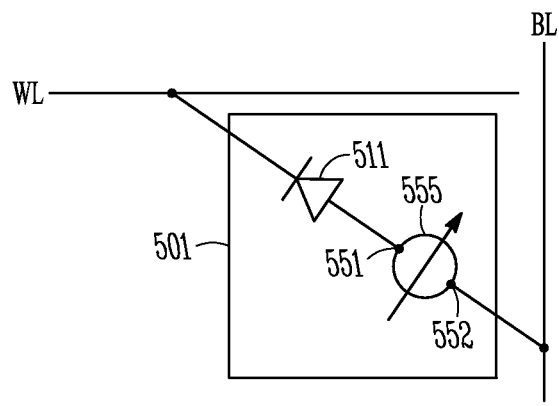
FIG. 5 shows a schematic diagram of an example memory cell having an access component coupled to a memory element, in accordance with various embodiments.

FIGS. 3 through 5 each show a schematic diagram of example embodiments of different memory cells 301, 401, 501 having different access components 311, 411, 511 coupled to memory elements 333, 444, 555, respectively. Lines labeled WL and BL in FIGS. 3 through 5 can correspond to any one of the access lines 104 and any one of the first data lines 106 of FIG. 1, respectively. FIGS. 3 through 5 show examples of access components 311, 411, 511 including a metal-oxide-semiconductor field-effect transistor (MOSFET), a bipolar junction transistor (BJT), and a diode, respectively. Memory cells 301, 401, and 501 can include other types of access components.

Each of the memory elements 333, 444, 555 can be coupled to and disposed between two electrodes, such as a first electrode 351 and a second electrode 352 of FIG. 3, a first electrode 451 and a second electrode 452 of FIG. 4, or a first electrode 551 and a second electrode 552 of FIG. 5. FIGS. 3 through 5 schematically show each of these electrodes as dots. Structurally, each of these electrodes can include a conductive material. Respective ones of the memory elements 333, 444, 555 can include a material that can be changed, for example, in response to a signal, to have different resistance values. The value of information stored in the memory element can correspond to the resistance value of the memory element. The access components 311, 411, 511 can enable signals to be transferred to and from the memory elements 333, 444, 555 via the respective pairs of electrodes during operation of the memory cells such as read, program, or erase operations.

For memory cells 301, 401, or 501 realized as a RRAM cell, electrodes 351 and 352, electrodes 451 and 452, electrodes 551 and 552 can be two electrodes of the RRAM cell with an operably variable resistance region between the two electrodes. Memory elements 333, 444, 555 can be realized as the operably variable resistance region. An oxide can be structured as the operably variable resistance region between the two electrodes. The oxide can include one or more of zirconium oxide, hafnium oxide, or titanium oxide. Memory cells 301, 401, or 501 structured as a resistive random access memory cells can include a buffer region between the respective oxide 333, 444, or 555 and one of the two corresponding electrodes 351 and 352, 451 and 452, or 551 and 552, respectively. In various embodiments, at least one of the two corresponding electrodes 351 and 352, 451 and 452, or 551 and 552, can include a material that is reactive with the oxide.

A programming operation may use signal WL to turn on the access components 311, 411, 511, and then apply a signal, for example a signal having a programming voltage or current, through the memory elements 333, 444, 555. Such a signal can cause at least a portion of the material of the memory elements 333, 444, 555 to change. The change can be reversed by, for instance, performing an erase operation. The differences in resistance values can be used to represent different states that represent different values of the information that is stored in the memory elements 333, 444, 555.

A read operation may use the signal WL to turn on access components 311, 411, or 511, and then apply a signal having a voltage or a current through the memory elements 333, 444, 555. The read operation may measure the resistance of the memory cells 301, 401, 501, based on a read voltage or current, to determine the corresponding value of information stored therein. For example, in each of memory cells 301, 401, 501, a different resistance value can impart a different magnitude (e.g., voltage or current value) to signal BL when a read current passes through the memory elements 333, 444, 555. Other circuitry of the memory device, for example a circuit such as I/O circuit 116 of FIG. 1, can use the signal BL to measure the resistance value of memory elements 333, 444, 555 to determine the value of the information stored therein.

In a read operation, the value (e.g., the voltage) of the signal (e.g., the signal BL in FIG. 3 or FIG. 4 or the signal WL in FIG. 5) that creates a current flowing through the memory element can be sufficient to create the current but insufficient to cause any portion of the memory element to change. Consequently, the value of the information stored in the memory element can remain unchanged during and after the read operation.

In an erase operation, the voltage value of the signal (e.g., the signal BL in FIG. 3 or FIG. 4 or the signal WL in FIG. 5) can have an opposite polarity from the voltage used in a programming operation. The signal, creating a current in this case, can therefore change, or reset, the material of the memory element to its original state; for example, a state prior to any programming being performed on the memory cells.

Figure 6:
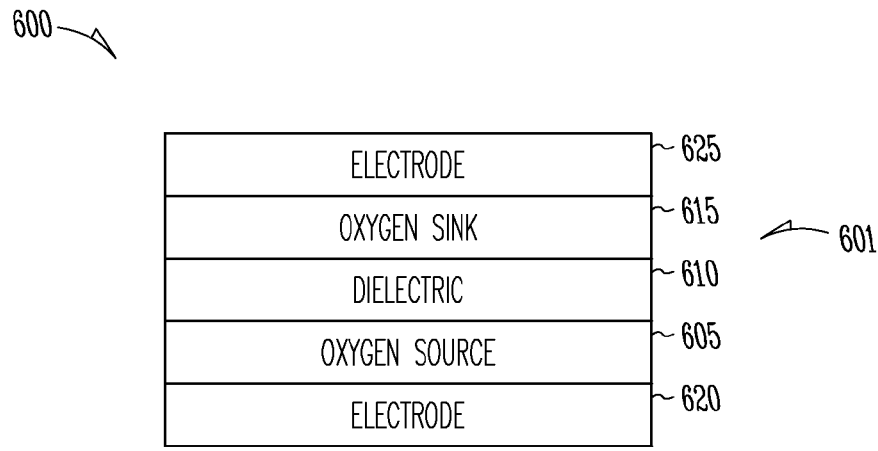
FIG. 6 shows a block diagram of an example apparatus including a resistive memory cell that illustrates components of the resistive memory cell, in accordance with various embodiments.

FIG. 6 shows a block diagram of an embodiment of an apparatus 600 including a resistive memory cell 601 that illustrates components of resistive memory cell 601. Resistive memory cell 601 can be structured as a field driven unipolar memory cell. The components of resistive memory cell 601 include an oxygen sink 615, an oxygen source 605, a dielectric 610 disposed between oxygen sink 615 and oxygen source 605, and two electrodes 620, 625 with oxygen sink 615, oxygen source 605, and dielectric 610 disposed between electrode 620 and electrode 625. Oxygen sink 615, oxygen source 605, and dielectric 610 can be structured such that setting a conductive filament in dielectric 610 to couple oxygen source 605 to oxygen sink 615 can be accomplished by applying a first voltage between electrode 620 and electrode 625, the first voltage having a first polarity. The conductive filament based on oxygen vacancy may allow for flow of high current during operation of the cell 601. Oxygen sink 615, oxygen source 605, and dielectric 610 can be structured such that resetting the conductive filament in dielectric 610 can be accomplished by applying a second voltage between electrode 620 and electrode 625, the second voltage having a second polarity such that the second polarity is the same as the first polarity. In an embodiment, oxygen sink 615, oxygen source 605, and dielectric 610 may be structured such that setting is performed with a higher magnitude, a shorter pulse, or both a higher magnitude and a shorter pulse of voltage between the two electrodes than is used for resetting. Other variations may include applying a longer pulse or shorter pulse and higher voltage or lower voltage in reset compared to set.

Oxygen sink 615 can be structured with a sufficiently large number of vacancies prior to initial operation of the resistive memory cell 601 such that resistive memory cell 601 is operable for a number of cycles. In an embodiment, the number of cycles can be equal to at least ten thousand cycles. Oxygen sink 615 can include, but is not limited to, one or more of praseodymium calcium manganese oxide (Pr,Ca)MnO$_x$, lanthanum strontium cobalt oxide (La,Sr)CaO$_x$, lanthanum strontium manganese oxide (La,Sr)MnOx, strontium titanium oxide SrTiOx, or materials in the form of ABO$_3$, ABO$_{3-\delta}$, ABO$_{3+\delta}$, A$_2$BO$_4$, A$_{0.6}$BO$_3$, A$_{1-x}$BO$_3$, A$_{0.3}$BO$_3$, and A$_n$B$_n$O$_{3n+1}$, where A and B are transition metal ions. Other oxygen based materials can be used as an oxygen sink material. Oxygen sink 615 can be a conductive metal oxide. Oxygen source 605 can include, but is not limited to, one or more of (Pr,Ca)MnO$_x$, (La,Sr)CaO$_x$, (La,Sr)MnOx, SrTiOx, or materials in the form of ABO$_3$, ABO$_{3-\delta}$, ABO$_{3+\delta}$, A$_2$BO$_4$, A$_{0.6}$BO$_3$, A$_{1-x}$BO$_3$, A$_{0.3}$BO$_3$, and A$_n$B$_n$O$_{3n+1}$, where A and B are transition metal ions. Other oxygen sources with high oxygen mobility and/or diffusivity can also be used as an oxygen source material. Oxygen source 605 can be a conductive metal oxide.

Dielectric 610 can be structured as a barrier region between the material composition of the oxygen source and the material composition of the oxygen sink. Dielectric 610 can include barrier material such that oxygen is inhibited from flowing between the oxygen source and the oxygen sink. Dielectric 610 can include, but is not limited to, one or more of ZrO$_x$, yttria-stabilized zirconia (YSZ), TaO$_x$, HfSiO$_x$, Al$_2$O$_3$, AlO$_x$, CoO, CoO$_x$, NiO, NiO$_x$, Fe$_2$O$_3$, Fe$_3$O$_4$, FeO$_x$, Cu$_2$O, CuO, CuO$_x$, Zn:FeO$_x$, HfO$_2$, HfO$_x$, HfSiO$_x$, SiO$_x$, TiO$_2$, TiO$_x$, MgO, MgO$_x$, MnO$_2$, MnO$_x$, Ti:NiO, TaO$_x$, Ta$_2$O$_5$, WO$_2$, WO$_3$, WO$_x$, ZnO, ZnO$_x$, ZrO$_2$, ZrO$_x$, ZrSiO$_x$, or combinations of these materials. In an embodiment, dielectric 610 can have a thickness in a range of about 20 Å to about 30 Å.

Electrode 620 and electrode 625 can include, but are not limited to, one or more of Pt, Ru, RuO$_x$, Au, Ir, or SrRuO. Other noble metals or combinations thereof can be used to form one or both of the two electrodes 620 and 625.

Resistive memory cell 601 can include an access device. Oxygen sink 615, oxygen source 605, dielectric 610, electrode 620, and electrode 625 can be arranged as a resistive memory element coupled to the access device in resistive memory cell 601. The access device and the resistive memory element can be arranged as a memory cell in an array of memory cells. The access device can be a transistor such as transistor 311 of FIG. 3, transistor 411 of FIG. 4, or some other transistor that can function as an access device. The access device can also be realized by a diode such as diode 511 of FIG. 5. Other access devices can be used that provide selectable access to provide voltages to electrode 620 or electrode 625 for operation of resistive memory cell 601 as a unipolar memory cell. Apparatus 600 can be structured as a memory device. For example, apparatus 600 can be realized using an architecture that is similar to or identical to memory device 100 of FIG. 1, memory device 200 of FIG. 2, or as another memory device.

In various embodiments, creation of a filament can be accomplished by generating a field in a unipolar cell, where both the field strength and current play a role in the breakdown of the barrier dielectric between an oxygen source and an oxygen sink disposed between two electrodes. As a first operation in forming (setting) a filament, a high voltage across the two electrodes can be applied in a high speed operation, for example as part of a short pulse or pulses, such that oxygen moves from the barrier dielectric into the oxygen sink, creating the filament in the barrier dielectric, without oxygen starting to move from the oxygen source into the barrier dielectric. The oxygen sink can be designed to have a substantial number of vacancies into which oxygen can move from the barrier dielectric into the oxygen sink. During a reset operation, the current flowing through the filament and the electric field can be high enough to generate heat that drives oxygen from the oxygen source into the filament, thereby healing the filament. Heat, high electric field induced ion drift, or both heat and high electric field induced ion drift can provide the mechanism to heal the filament. The filament can be completely healed during a reset operation. In an embodiment, the applied voltage to the unipolar cell for filament healing may be lower than the breakdown voltage used to generate the filament, and a longer pulse at this lower applied voltage may be used to drive oxygen into the filament. However, the reset applied voltage may not necessarily be lower than the set applied voltage and/or longer in its pulse.

Figure 7:
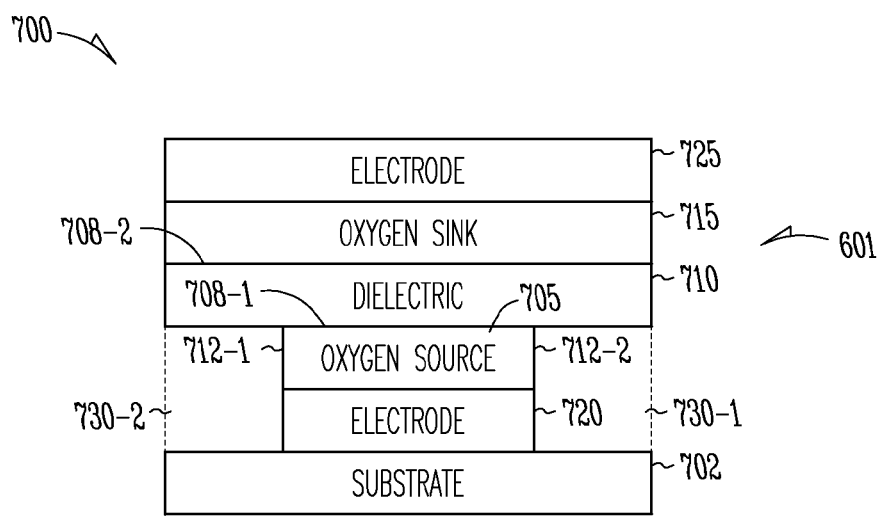
FIG. 7 shows a block diagram of an example apparatus including a resistive memory cell that illustrates components of the resistive memory cell, in accordance with various embodiments.

FIG. 7 shows a block diagram of an embodiment of an apparatus 700 including a resistive memory cell 701 that illustrates components of resistive memory cell 701. Resistive memory cell 701 can be structured as a field driven unipolar memory cell. The components of resistive memory cell 701 include an oxygen sink 715, an oxygen source 705, a dielectric 710 disposed between oxygen sink 715 and oxygen source 705, and two electrodes 720, 725 with oxygen sink 715, oxygen source 705, and dielectric 710 disposed between electrode 720 and electrode 725. Oxygen sink 715, oxygen source 705, and dielectric 710 can be structured such that setting a conductive filament in dielectric 710 to couple the oxygen source 705 to oxygen sink 715 can be accomplished by applying a first voltage between electrode 720 and electrode 725, the first voltage having a first polarity. Oxygen sink 715, oxygen source 705, and dielectric 710 can be structured such that resetting the conductive filament in dielectric 710 can be accomplished by applying a second voltage between electrode 720 and electrode 725, the second voltage having a second polarity such that the second polarity is the same as the first polarity. Oxygen sink 715, oxygen source 705, and dielectric 710 can be structured such that the setting is accomplished with a higher magnitude of voltage between the two electrodes than is used for resetting.

FIG. 7 shows an example embodiment that illustrates that a resistive memory cell that has a dielectric stacked between an oxygen source and an oxygen sink, operable as a unipolar memory device that can be realized in a number of arrangements. Dielectric 710 can contact oxygen source 705 across a surface 708-1 of oxygen source 705 such that dielectric 710 extends beyond the ends 712-1 and 712-2 of surface 708-1. Oxygen sink 715 can contact dielectric 710 across a surface 708-2 of dielectric 710 such that oxygen sink 715 extends beyond ends 712-1 and 712-2 of surface 708-1 of oxygen source 705. In addition, the order of the oxygen sink 715, oxygen source 705, and dielectric 710 disposed between electrode 720 and electrode 725 can be reversed such that electrode 725 is disposed on and contacting substrate 702, rather than electrode 720 contacting substrate 702 shown in FIG. 7.

Oxygen sink 715 can be structured with a sufficiently large number of vacancies prior to initial operation of the resistive memory cell 701 such that the resistive memory cell 701 is operable for a number of cycles. In an embodiment, the number of cycles can be equal to at least ten thousand cycles. Oxygen sink 715 can include, but is not limited to, one or more of $(Pr,Ca)MnO_x$, $(La,Sr)CaO_x$, $(La,Sr)MnOx$, $SrTiOx$, or materials in the form of $ABO_3$, $ABO_{3-\delta}$, $ABO_{3+\delta}$, $A_2BO_4$, $A_{0.6}BO_3$, $A_{1-x}BO_3$, $A_{0.3}BO_3$, and $A_nB_nO_{3n+1}$, where A and B are transition metal ions. Other oxygen based materials can be used as an oxygen sink material. Oxygen sink 715 can be a conductive metal oxide. Oxygen source 705 can include, but is not limited to, one or more of $(Pr,Ca)MnO_x$, $(La,Sr)CaO_x$, $(La,Sr)MnOx$, $SrTiOx$, or materials in the form of $ABO_3$, $ABO_{3-\delta}$, $ABO_{3+\delta}$, $A_2BO_4$, $A_{0.6}BO_3$, $A_{1-x}BO_3$, $A_{0.3}BO_3$, and $A_nB_nO_{3n+1}$, where A and B are transition metal ions. Other oxygen sources with high oxygen mobility and/or diffusivity can also be used as an oxygen source material. Oxygen source 705 can be a conductive metal oxide.

Dielectric 710 can be structured as a barrier region between the material composition of the oxygen source and the material composition of the oxygen sink. Dielectric 710 can include barrier material such that oxygen is inhibited from flowing between oxygen source 705 and oxygen sink 715. Dielectric 710 can include, but is not limited to, one or more of $ZrO_x$, YSZ, $TaO_x$, $HfSiO_x$, $Al_2O_3$, $AlO_x$, CoO, $CoO_x$, NiO, $NiO_x$, $Fe_2O_3$, $Fe_3O_4$, $FeO_x$, $Cu_2O$, CuO, $CuO_x$, $Zn:FeO_x$, $HfO_2$, $HfO_x$, $HfSiO_x$, $SiO_x$, $TiO_2$, $TiO_x$, MgO, $MgO_x$, $MnO_2$, $MnO_x$, $Ti:NiO$, $TaO_x$, $Ta_2O_5$, $WO_2$, $WO_3$, $WO_x$, ZnO, $ZnO_x$, $ZrO_2$, $ZrO_x$, $ZrSiO_x$, or combinations of these materials. In an embodiment, dielectric 710 can have a thickness of in a range of about 20 Å to about 30 Å.

Electrode 720 and electrode 725 can include, but are not limited to, one or more of Pt, Ru, $RuO_x$, Au, Ir, or SrRuO. Other noble metals or combinations thereof can be used in one or both of the two electrodes 720 and 725. Electrode 720 can be disposed within or between insulative regions 730-1 and 730-2. Insulative regions 730-1 and 730-2 can be realized as silicon nitride regions. Oxygen source 705 can be disposed adjacent electrode 720 within or between insulative regions 730-1 and 730-2.

Resistive memory cell 701 can include an access device. Oxygen sink 715, oxygen source 705, dielectric 710, electrode 720, and electrode 725 can be arranged as a resistive memory element coupled to the access device in resistive memory cell 701. The access device can be coupled to the resistive memory element and be arranged as a memory cell in an array of memory cells. The access device can a transistor such as transistor 311 of FIG. 3, transistor 411 of FIG. 4, or some other transistor that can function as an access device. The access device can also be realized by a diode such as diode 511 of FIG. 5. Other access devices can be used that provide selectable access to provide voltages to electrode 720 or electrode 725 for operation of resistive memory cell 701 as a unipolar memory cell. Apparatus 700 can be structured as a memory device. For example, apparatus 700 can be realized with an architecture similar to or identical to memory device 100 of FIG. 1, memory device 200 of FIG. 2, or as another memory device.

Figure 8B:
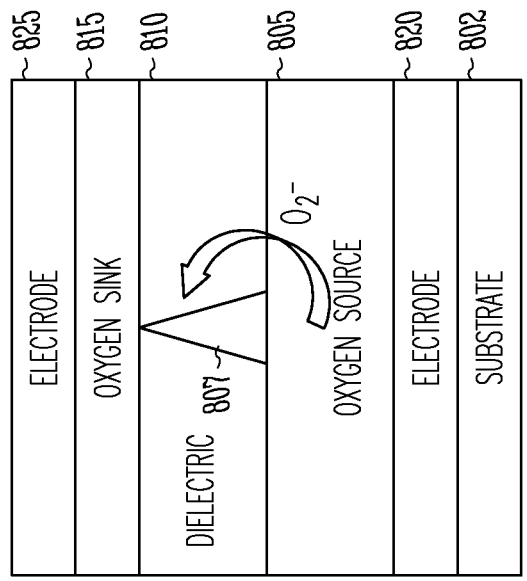
FIG. 8B shows a block diagram illustrating filament reset in the example resistive memory cell of FIG. 8A, in accordance with various embodiments.
Figure 8A:
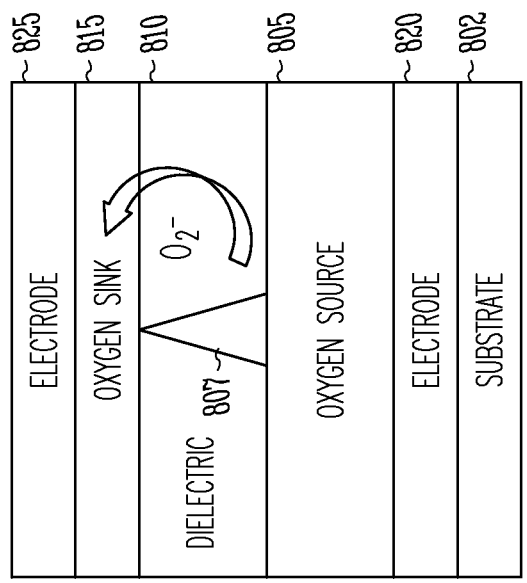
FIG. 8A shows a block diagram of filament generation in an example resistive memory cell, in accordance with various embodiments.

FIG. 8A shows a block diagram of an embodiment of a resistive memory cell 801 in which a filament 807 in dielectric 810 is generated. Generating filament 807 in dielectric 810 can provide a conductive path from oxygen source 805 to oxygen sink 815. Filament 807 can be generated by providing a voltage difference between electrode 825 and electrode 820 disposed on substrate 802. With the application of the voltage difference, oxygen can be driven from dielectric 810 into oxygen sink 815. The voltage difference can be applied with electrode 820 at 0 volts. The voltage difference can be applied with electrode 820 at a voltage other than 0 volts. The voltage can be applied over a short period such that oxygen does not start moving from oxygen source 805 into dielectric 810. Memory cell 801 can be formed in a manner similar to or identical to memory cell 601 or memory cell 701.

FIG. 8B shows a block diagram of an embodiment of a resistive memory cell 801 in which filament 807 in dielectric 810 is reset. Resetting filament 807 can reduce the conductive path from oxygen source 805 to oxygen sink 815, increasing the resistance of resistive memory cell 801. The conductive path can be reduced by healing filament 807. Filament 807 can be healed by driving oxygen from oxygen source 805 into dielectric 810. The oxygen can be driven by providing a voltage difference between electrode 825 and electrode 820 disposed on substrate 802. The voltage difference can be applied with electrode 820 at 0 volts. The voltage difference can be applied with electrode 820 at a voltage other than 0 volts. The polarity of the voltage difference to heal filament 807 can be the same as the polarity of the voltage difference used to generate the filament. The magnitude of the voltage difference to generate the filament can be greater than the magnitude of the voltage difference used to heal the filament.

Figure 9:
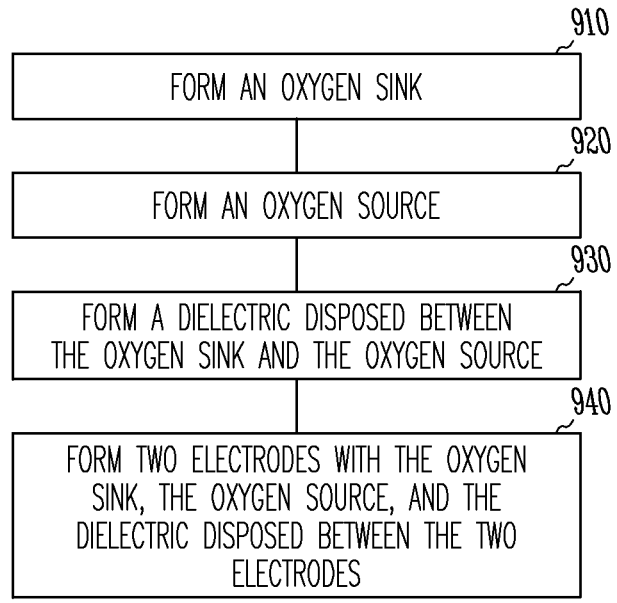
FIG. 9 shows features of an embodiment of an example method of forming a resistive memory cell, in accordance with various embodiments.

FIG. 9 shows features of an embodiment of an example method of forming a resistive memory cell. At 910, an oxygen sink is formed. The oxygen sink is formed as part of the resistive memory cell. Forming the oxygen sink can include processing material of the oxygen sink at a temperature high relative to that of forming the oxygen source to generate oxygen vacancies in the material of the oxygen sink. Forming the oxygen sink can include processing material of the oxygen sink at a lower oxygen partial pressure than what is used to form the oxygen source. The temperature to form the oxygen sink may be in a range from about 300° C. to about 800° C. Oxygen partial pressure to form the oxygen sink may range from about 0 to several Torr. Other temperatures, oxygen partial pressures, or combinations of temperatures and oxygen partial pressures may be used. Typically, higher temperature and lower oxygen partial pressure favor oxygen vacancies making these conditions favourable to be used for the oxygen sink. Forming the oxygen sink can include processing material of the oxygen sink based on a selected stoichiometry to generate oxygen vacancies in the material. Forming the oxygen sink can include forming a conductive metal oxide.

At 920, an oxygen source is formed. The oxygen source is formed as part of the resistive memory cell. Forming the oxygen source can include forming a conductive metal oxide. At 930, a dielectric is formed such that the dielectric is disposed between the oxygen sink and the oxygen source. Forming the dielectric can include forming a barrier to inhibit the flow of oxygen between the oxygen source and the oxygen sink. At 940, two electrodes are formed with the oxygen sink, the oxygen source, and the dielectric disposed between the two electrodes. The oxygen sink, the oxygen source, and the dielectric can be structured such that setting a conductive filament in the dielectric coupling the oxygen source to the oxygen sink can be operably performed using a first voltage applied between the two electrodes. Resetting the filament in the dielectric of this structure can be operably performed using a second voltage applied between the two electrodes with the second voltage having a polarity that is the same as the polarity of the first voltage.

In an example design for a unipolar memory cell, with a barrier dielectric having a thickness of about 20 Å, a filament of approximately 5 to 8 monolayers, and a filament width of about 20 Å, there can be approximately 125 atoms in the filament. Since the operational mechanism of the unipolar resistive memory element involves a one-way transport of oxygen, the oxygen source can be designed to contain sufficient amount of oxygen to last for a designed period. For example, as a replacement target of a NAND device in a cross-point architecture, the designed period can be set to 10,000 (10K) cycles. For complete transport of all available oxygen from the oxygen source, $125 \times 10,000 = 125 \times 10^4$ atoms are used for 10K cycles. $PrCaMnO_3$ can be used as an oxygen source, where $PrCaMnO_3$ has a unit cell volume of $2.21884 \times 10^{-28}$ m$^3$ with lattice constants of $a=5.40\times10^{-10}$, $b=7.61\times10^{-10}$, and $c=5.40\times10^{-10}$. Using $PrCaMnO_3$ as an oxygen source, assuming conductivity drops significantly beyond 5% vacancy density, a thickness of approximately 125 nm of $PrCaMnO_3$ can be used. However, some types of operation may lead to only a percentage of the oxygen being replaced. Appropriate thickness and composition of an oxygen source having different characteristics of barrier dielectrics and filaments can be determined in selecting appropriate materials to construct the unipolar memory cell.

Figure 10:
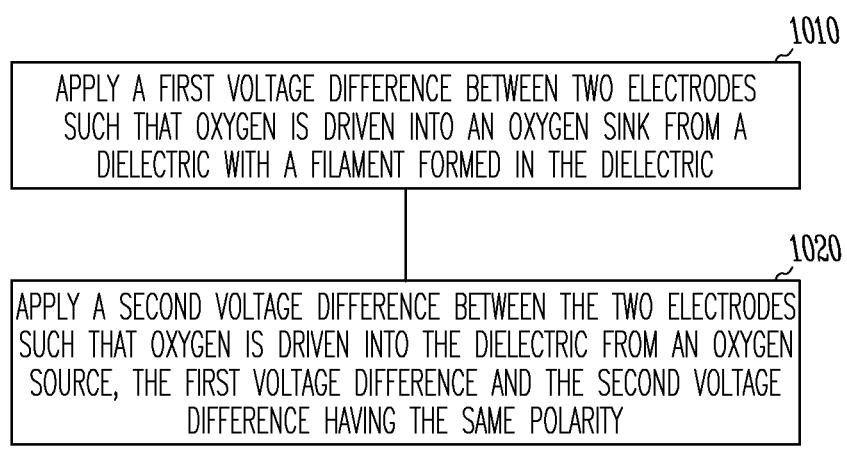
FIG. 10 shows features of an embodiment of an example method of operating a resistive memory cell, in accordance with various embodiments.

FIG. 10 shows features of an embodiment of an example method of operating a resistive memory cell. At 1010, a first voltage difference is applied between two electrodes such that oxygen is driven into an oxygen sink from a dielectric with a filament formed in the dielectric. The oxygen sink is disposed between one of the two electrodes and the dielectric. Applying the first voltage difference can include applying the first voltage difference for a time period such that oxygen does not substantially move from the oxygen source into the dielectric. The amount of oxygen that moves to the dielectric from the oxygen source in this time period can be limited to less than an amount that would prevent the formation of the filament or less than an amount that would increase the resistance of the filament being formed to a level greater than a selected resistance. The magnitude of the first voltage difference can be set higher than a threshold voltage to breakdown the dielectric forming a filament in which oxygen has been driven from the filament. The formed filament can provide a conductive path from the surface of the dielectric contacting the oxygen sink to a surface of the dielectric opposite the surface contacting the oxygen sink. The threshold voltage may depend on the thickness of the dielectric, the material composition of the dielectric, combinations of other characteristics of the dielectric, and characteristics of the oxygen sink.

At 1020, a second voltage difference is applied between the two electrodes such that oxygen is driven into the dielectric from an oxygen source, where the first voltage difference and the second voltage difference have the same polarity. The oxygen source is disposed between the dielectric and the other one of the two electrodes. Applying the second voltage difference can include applying the second voltage difference at a magnitude sufficient to drive oxygen into the dielectric, removing the filament in the dielectric to an extent that reduces coupling of the oxygen source to the oxygen sink, and increases resistance between the two electrodes. Applying the second voltage difference can include applying the second voltage to remove the filament completely. The magnitude of the second voltage difference can be set higher than a threshold voltage to move oxygen into the filament in the dielectric. The magnitude of the second voltage difference and the magnitude of the threshold voltage of the second voltage difference can be set at a level lower than the magnitude of the first voltage. The threshold voltage may depend on the thickness of the dielectric, the material composition of the dielectric, combinations of other characteristics of the dielectric, and characteristics of the oxygen source. The oxygen source can have a relatively high oxygen diffusivity or mobility under an applied field. Applying the first voltage difference and the applying the second voltage difference can include using voltages such that the memory cell is tuned to operate in two resistance states.

Figure 11:
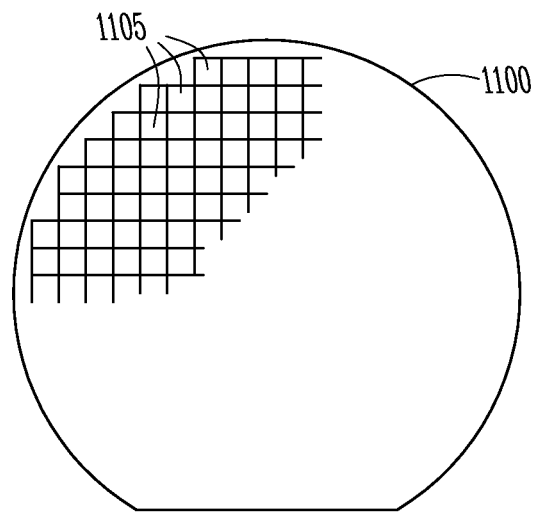
FIG. 11 shows a finished wafer, in accordance with various embodiments.

FIG. 11 illustrates an example of a wafer 1100 arranged to provide multiple electronic components. Wafer 1100 can be provided as a wafer in which a plurality of dice 1105 can be fabricated. Alternatively, wafer 1100 can be provided as a wafer in which the plurality of dice 1105 have been processed to provide electronic functionality and are awaiting singulation from wafer 1100 for packaging. Wafer 1100 can be provided as a semiconductor wafer, a semiconductor on insulator wafer, or other appropriate wafer for processing electronic devices such as an integrated circuit chips. Wafer 1100 can be fabricated in accordance with any one or more embodiment related to FIGS. 1-10.

Using various masking and processing techniques, each die 1105 can be processed to include functional circuitry such that each die 1105 is fabricated as an integrated circuit with the same functionality and packaged structure as the other dice on wafer 1100. Alternatively, using various masking and processing techniques, various sets of dice 1105 can be processed to include functional circuitry such that not all of the dice 1105 are fabricated as an integrated circuit with the same functionality and packaged structure as the other dice on wafer 1100. A packaged die having circuits integrated thereon providing electronic capabilities is herein referred to as an integrated circuit (IC).

Wafer 1100 can include resistive memories, where each resistive memory is located in a die 1105. The resistive memory may be structured as a RRAM. Each resistive memory can include resistive memory cells. Each resistive memory cell can include two electrodes with a stacked arrangement between the two electrodes, where the stacked arrangement includes a barrier dielectric between an oxygen source and an oxygen sink. The barrier dielectric can be structured as the operably variable resistance region of the resistive memory cell in which a filament can be set and reset using voltages of the same polarity. The magnitude of the voltage setting the filament can be greater than the magnitude of the voltage at which the filament is reset.

Figure 12:
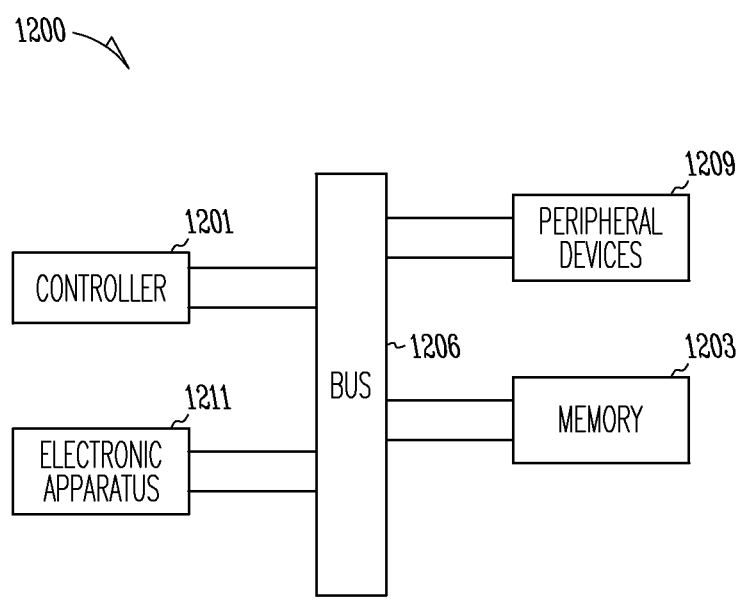
FIG. 12 shows a block diagram of various features of an electronic system, in accordance with various embodiments.

FIG. 12 shows a block diagram of a system 1200 that includes a memory 1203 structured as a resistive memory. The resistive memory can be a resistive random access memory. Each resistive memory cell can include two electrodes with a stacked arrangement between the two electrodes, where the stacked arrangement includes a barrier dielectric between an oxygen source and an oxygen sink. The barrier dielectric can be structured as the operably variable resistance region of the resistive memory cell in which a filament can be set and reset using voltages of the same polarity. The magnitude of the voltage setting the filament can be greater than the magnitude of the voltage at which the filament is reset. The unipolar device architectures of the resistive memory cell and the memory can be realized in a manner similar to or identical to structures in accordance with various embodiments as discussed herein.

System 1200 can include a controller 1201 operatively coupled to memory 1203. System 1200 can also include an electronic apparatus 1211 and peripheral devices 1209. One or more of controller 1201, memory 1203, electronic apparatus 1211, and peripheral devices 1209 can be in the form of one or more ICs. A bus 1206 provides electrical conductivity between and/or among various components of system 1200. In an embodiment, bus 1206 can include an address bus, a data bus, and a control bus, each independently configured. In an alternative embodiment, bus 1206 uses common conductive lines for providing one or more of address, data, or control, the use of which is regulated by controller 1201. Controller 1201 can be realized in the form or one or more processors.

Electronic apparatus 1211 may include additional memory. Memory in system 1200 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 1209 may include displays, imaging devices, printing devices, wireless devices, additional storage memory, and control devices that may operate in conjunction with controller 1201. In various embodiments, system 1200 can include, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. An apparatus comprising:
    a resistive memory cell including:
        an oxygen sink;
        an oxygen source;
        a dielectric disposed between the oxygen sink and the oxygen source; and
        two electrodes having the oxygen sink, the oxygen source, and the dielectric disposed therebetween, the oxygen source and the dielectric structured such that setting a conductive filament in the dielectric to couple the oxygen source to the oxygen sink can be accomplished by applying a first voltage between the two electrodes, the first voltage having a first polarity, and such that resetting the filament in the dielectric can be accomplished by applying a second voltage between the two electrodes, the second voltage having a second polarity, the second polarity being the same as the first polarity.

2. The apparatus of claim 1, wherein the oxygen sink, the oxygen source, and the dielectric are structured such that setting is accomplished using a higher magnitude, a shorter pulse, or both a higher magnitude and a shorter pulse of voltage between the two electrodes than is used to accomplish the resetting.

3. The apparatus of claim 1, wherein the oxygen sink, the oxygen source, and the dielectric are structured such that the resistive memory cell is operable with a longer pulse or shorter pulse and higher voltage or lower voltage in the resetting compared to the setting.

4. The apparatus of claim 1, wherein the oxygen sink is structured with a sufficient number of vacancies prior to initial operation of the resistive memory cell such that the resistive memory cell is operable for a selected number of cycles.

5. The apparatus of claim 4, wherein the number of cycles is equal to at least ten thousand cycles.

6. The apparatus of claim 1, wherein the dielectric is structured as a barrier region between the oxygen sink and the oxygen source.

7. The apparatus of claim 1, wherein the oxygen sink includes one or more of $(Pr,Ca)MnO_x$, $(La,Sr)CaO_x$, $(La,Sr)MnOx$, $SrTiOx$, or materials in the form of $ABO_3$, $ABO_{3-\delta}$, $ABO_{3+\delta}$, $A_2BO_4$, $A_{0.6}BO_3$, $A_{1-x}BO_3$, $A_{0.3}BO_3$, and $A_nB_nO_{3n+1}$, where A and B are transition metal ions.

8. The apparatus of claim 1, wherein the oxygen source includes one or more of $(Pr,Ca)MnO_x$, $(La,Sr)CaO_x$, $(La,Sr)MnOx$, $SrTiOx$, or materials in the form of $ABO_3$, $ABO_{3-\delta}$, $ABO_{3+\delta}$, $A_2BO_4$, $A_{0.6}BO_3$, $A_{1-x}BO_3$, $A_{0.3}BO_3$, and $A_nB_nO_{3n+1}$, where A and B are transition metal ions.

9. The apparatus of claim 1, wherein one or both of the two electrodes include one or more of Pt, Ru, $RuO_x$, Ir, or SrRuO.

10. The apparatus of claim 1, wherein the dielectric includes one or more of one or more of $ZrO_x$, YSZ, $TaO_x$, $HfSiO_x$, $Al_2O_3$, $AlO_x$, CoO, $CoO_x$, NiO, $NiO_x$, $Fe_2O_3$, $Fe_3O_4$, $FeO_x$, $Cu_2O$, CuO, $CuO_x$, $Zn:FeO_x$, $HfO_2$, $HfO_x$, $HfSiO_x$, $SiO_x$, $TiO_2$, $TiO_x$, MgO, $MgO_x$, $MnO_2$, $MnO_x$, $Ti:NiO$, $TaO_x$, $Ta_2O_5$, $WO_2$, $WO_3$, $WO_x$, ZnO, $ZnO_x$, $ZrO_2$, $ZrO_x$, $ZrSiO_x$, or combinations of these materials.

11. The apparatus of claim 1, wherein the dielectric has a thickness in a range of about 20 Å to about 30 Å.

12. An apparatus comprising:
an access device;
a resistive memory element coupled to the access device, the resistive memory element including:
an oxygen sink;
an oxygen source;
a dielectric structured as an operably variable resistance region, the dielectric disposed between the oxygen sink and the oxygen source; and
two electrodes, with one of the two electrodes coupled to the access device, the two electrodes having the oxygen sink, the oxygen source, and the dielectric disposed therebetween, the oxygen source and the dielectric structured such that setting a conductive filament in the dielectric to couple the oxygen source to the oxygen sink can be accomplished by applying a first voltage between the two electrodes via the access device, the first voltage having a first polarity, and such that resetting the filament in the dielectric can be accomplished by applying a second voltage between the two electrodes via the access device, the second voltage having a second polarity, the second polarity being the same as the first polarity.

13. The apparatus of claim 12, wherein the access device and the resistive memory element are arranged as a memory cell in an array of memory cells.

14. The apparatus of claim 12, wherein the oxygen sink and the oxygen source are conductive metal oxides.

15. The apparatus of claim 12, wherein the dielectric includes barrier material to inhibit oxygen flow between the oxygen source and the oxygen sink.

16. The apparatus of claim 12, wherein the dielectric contacts the oxygen source across a surface of the oxygen source such that the dielectric extends beyond ends of the surface.

17. The apparatus of claim 16, wherein the oxygen sink contacts the dielectric across a surface of the dielectric such that the oxygen sink extends beyond the ends of the surface of the oxygen source.

18. The apparatus of claim 12, wherein the access device is a transistor.

19. The apparatus of claim 12, where the apparatus is a memory device.

20. A method comprising:
forming a resistive memory cell;
forming an oxygen sink as part of the resistive memory cell;
forming an oxygen source as part of the resistive memory cell;
forming a dielectric disposed between the oxygen sink and the oxygen source; and
forming two electrodes having the oxygen sink, the oxygen source, and the dielectric disposed therebetween, with the oxygen sink, the oxygen source, and the dielectric structured such that setting a conductive filament in the dielectric to couple the oxygen source to the oxygen sink is accomplished by applying a first voltage between the two electrodes, the first voltage having a first polarity, and such that resetting the filament in the dielectric is accomplished by applying a second voltage between the two electrodes, the second voltage having a second polarity, the second polarity being the same as the first polarity.

21. The method of claim 20, wherein forming the oxygen sink includes processing material of the oxygen sink at a higher temperature or lower oxygen partial pressure than is used to form the oxygen source to generate oxygen vacancies in the material.

22. The method of claim 20, wherein forming the oxygen sink includes processing material of the oxygen sink based on a stoichiometry selected to generate oxygen vacancies in the material.

23. The method of claim 20, wherein forming the oxygen source and forming the oxygen sink include forming conductive metal oxides.

24. The method of claim 20, wherein forming the dielectric includes forming a barrier that can inhibit oxygen flow between the oxygen source and the oxygen sink.

25. A method comprising:
applying a first voltage difference between two electrodes such that oxygen is driven into a oxygen sink from a dielectric with a filament formed in the dielectric, the oxygen sink disposed between one of the two electrodes and the dielectric; and
applying a second voltage difference between the two electrodes such that oxygen is driven into the dielectric from an oxygen source, the oxygen source disposed between the dielectric and the other one of the two electrodes, the first voltage difference and the second voltage difference having the same polarity.

26. The method of claim 25, wherein applying the first voltage difference and the applying the second voltage difference includes using voltages such that the memory cell is tuned to operate in two resistance states.

27. The method of claim 25, wherein applying the first voltage difference includes applying the first voltage difference for a time period such that no substantial amount of oxygen moves from the oxygen source into the dielectric.

28. The method of claim 25, wherein applying the second voltage difference includes applying the second voltage difference at a magnitude sufficient to drive oxygen into the dielectric to remove the filament in the dielectric to reduce coupling of the oxygen source to the oxygen sink and increase resistance between the two electrodes.

29. The method of claim 28, wherein applying the second voltage difference includes applying the second voltage to completely remove the filament.

* * * * *